(12) United States Patent
Guan et al.

(10) Patent No.: US 12,238,877 B2
(45) Date of Patent: Feb. 25, 2025

(54) ELECTRONIC DEVICE

(71) Applicant: AMBIT MICROSYSTEMS (SHANGHAI) LTD., Shanghai (CN)

(72) Inventors: Xu Guan, Shenzhen (CN); You-Li He, Shenzhen (CN)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 34 days.

(21) Appl. No.: 18/370,004

(22) Filed: Sep. 19, 2023

(65) Prior Publication Data

US 2024/0431044 A1 Dec. 26, 2024

(30) Foreign Application Priority Data

Jun. 21, 2023 (CN) .......................... 202310744516.6

(51) Int. Cl.
*G06F 1/16* (2006.01)
*H05K 5/00* (2006.01)
*H05K 5/02* (2006.01)
*H05K 7/00* (2006.01)

(52) U.S. Cl.
CPC ................................. *H05K 5/0208* (2013.01)

(58) Field of Classification Search
CPC ....... H05K 5/0208; H05K 5/0204; H05K 5/02
See application file for complete search history.

(56) References Cited

U.S. PATENT DOCUMENTS

| | | | |
|---|---|---|---|
| 9,648,765 B1* | 5/2017 | Huang | H05K 5/0047 |
| 10,285,288 B1* | 5/2019 | Su | H05K 5/03 |
| 10,664,626 B2 | 5/2020 | Tang et al. | |
| 10,761,403 B2* | 9/2020 | Wang | G02B 6/0066 |
| 10,881,012 B1* | 12/2020 | Wu | H05K 5/0013 |
| 12,085,993 B2* | 9/2024 | Goh | G06F 1/1656 |
| 2014/0096467 A1* | 4/2014 | Norton | E04F 13/0833 |
| | | | 52/582.2 |
| 2015/0313027 A1* | 10/2015 | Lin | H05K 5/0208 |
| | | | 361/752 |

(Continued)

FOREIGN PATENT DOCUMENTS

| | | |
|---|---|---|
| CN | 110418527 A | 11/2019 |
| TW | I692686 B | 5/2020 |
| TW | I740116 B | 9/2021 |

*Primary Examiner* — Anthony M Haughton
(74) *Attorney, Agent, or Firm* — ScienBiziP, P.C.

(57) ABSTRACT

An electronic device includes a housing mechanism defining an accommodating chamber, a circuit board assembly accommodated in the accommodating chamber, and an anti-disassembly mechanism. The circuit board assembly includes a substrate and a controller connected to the substrate, and the substrate includes a magnetic attraction area. The anti-disassembly mechanism includes a light sensor configured to detect a light intensity in the accommodating chamber, an electromagnetic element opposite to the magnetic attraction area, and an elastic element resisting between the electromagnetic element and the substrate. When the light intensity signal is less than or equal to the light intensity threshold, the controller controls the electromagnetic element to be powered on to generate magnetic attraction to the magnetic attraction area, so that the electromagnetic element is attracted to the magnetic attraction area.

20 Claims, 6 Drawing Sheets

(56) References Cited

U.S. PATENT DOCUMENTS

| | | | |
|---|---|---|---|
| 2016/0055355 A1* | 2/2016 | Huang | G06F 21/87 |
| | | | 726/34 |
| 2016/0055356 A1* | 2/2016 | Huang | H01R 13/6397 |
| | | | 726/35 |
| 2016/0066444 A1* | 3/2016 | Fan | H05K 5/0208 |
| | | | 439/78 |
| 2019/0258136 A1* | 8/2019 | Yu | G02B 26/0816 |
| 2020/0125773 A1 | 4/2020 | Tang et al. | |

* cited by examiner

ELECTRONIC DEVICE

FIELD

The subject matter herein generally relates to the field of electronic technology, in particular to an electronic device.

BACKGROUND

At present, it is desired that an electronic device be embedded with an anti-disassembly function for the purpose of alerting or distinguishing the cause of faults, confirming whether users are responsible for disassembling the electronic device, and ensuring security of the internal data stored in the electronic devices. In order to prevent the electronic device from being dismantled by a user without permission during a warranty period, manufacturers usually affix a tamper proof label at the junction of the upper and lower covers of the electronic device. The tamper proof label may be made of fragile paper material. When the user takes apart the electronic device without permission, the tamper proof label becomes damaged as a result. When the electronic device is returned to the factory for maintenance, the completeness of the tamper proof label is used to determine whether the electronic device has been previously disassembled.

However, since the tamper proof label is attached to the electronic device by bonding, the tamper proof label may be destroyed during normal use of the electronic device, and special tools may be used to remove the tamper proof label without causing damages to the tamper proof label. In such two situations, a determination that the electronic device has been disassembled by the user without permission may be misguided.

BRIEF DESCRIPTION OF THE DRAWINGS

Implementations of the present technology will now be described, by way of embodiment, with reference to the attached figures.

DETAILED DESCRIPTION

Figure 1:
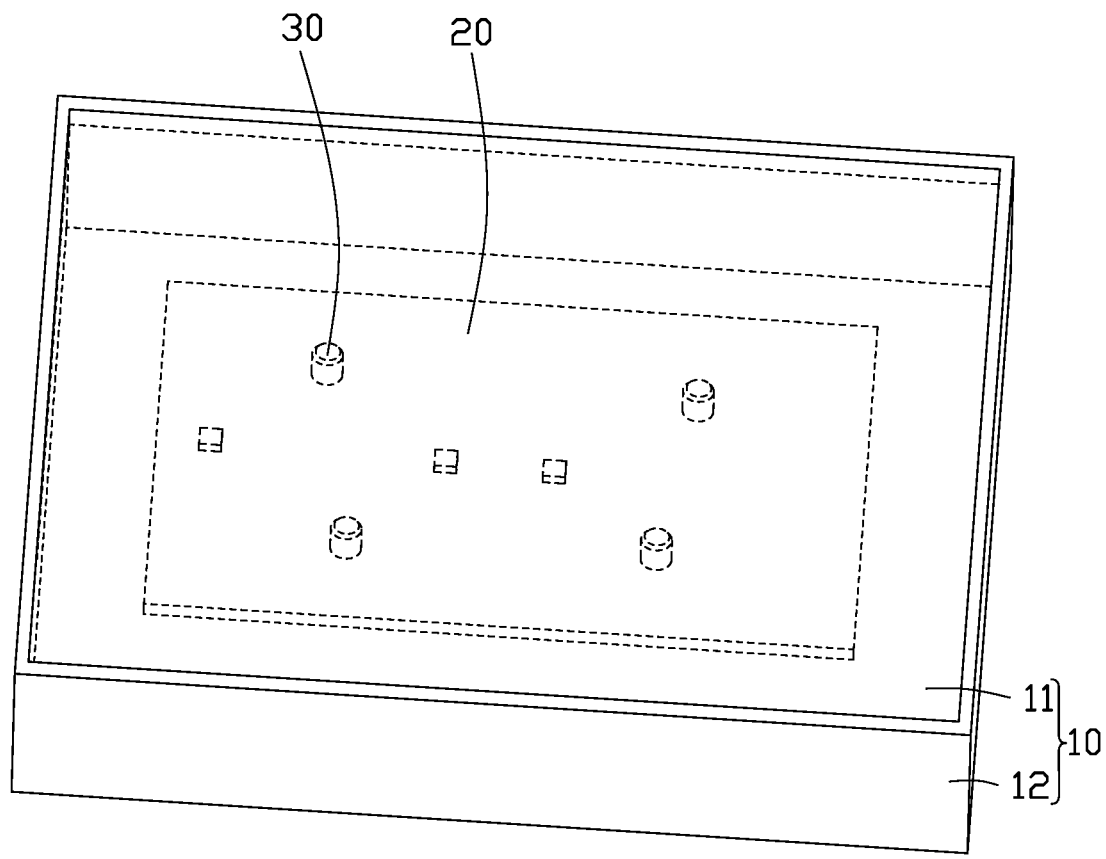
FIG. 1 is a schematic view of an embodiment of an electronic device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

It should be understood that considering a factor of actual machining tolerance, in the present application, when two elements are vertical to each other, a tolerance of −10% to 10% is allowed between the two elements.

An embodiment of the present application discloses an electronic device. The electronic device includes a housing mechanism, a circuit board assembly, and an anti-disassembly mechanism. The housing mechanism defines an accommodating chamber. The circuit board assembly is disposed in the accommodating chamber. The circuit board assembly includes a substrate and a controller connected to the substrate. The substrate includes a magnetic attraction area. The anti-disassembly mechanism includes a light sensor, an electromagnetic element, and an elastic element. The light sensor is used to detect a light intensity in the accommodating chamber. The electromagnetic element and the magnetic attraction area are disposed opposite to each other, and the elastic element is disposed between the electromagnetic element and the substrate. The light sensor and the electromagnetic element are both electrically connected to the controller. The controller is configured to receive a light intensity signal from the light sensor and compare the light intensity signal with a preset light intensity threshold. The controller is further configured to control the electromagnetic element to be powered on or powered off according to a comparison result between the light intensity signal and the light intensity threshold. When the light intensity signal is less than or equal to the light intensity threshold, the controller controls the electromagnetic element to be powered on to generate magnetic attraction to the magnetic attraction area. When the light intensity signal is greater than the light intensity threshold, the controller controls the electromagnetic element to be powered off, and the electromagnetic element is separated from the magnetic attraction area by an elastic restoring force of the elastic element.

In the electronic device, in the case where the housing mechanism has not been disassembled, the light sensor detects that the light intensity in the accommodating chamber will be less than or equal to the light intensity threshold. In the case where the housing mechanism has been disassembled or damaged, a gap communicating with the accommodating chamber will be formed in the housing mechanism, so that the light intensity in the accommodating chamber will be increased, and the light sensor detects that the light intensity in the accommodating chamber will be greater than the light intensity threshold. When the light intensity signal is less than or equal to the light intensity threshold, the electromagnetic element is energized to generate magnetic attraction to the magnetic attraction area. When the light intensity signal is greater than the light intensity threshold, the electromagnetic element is powered off to be separated from the magnetic attraction area by an elastic restoring force of the elastic element. When the user observes that the electromagnetic element has not been installed on the magnetic suction area, it can be determined that the housing mechanism has been disassembled, thereby accurately detecting whether the electronic device has been disassembled.

Referring to FIG. 1, an embodiment of an electronic device 100 is illustrated. The electronic device 100 can be, but is not limited to, servers, computers, mobile phones, tablets, card readers, password keyboards, etc.

Figure 2:
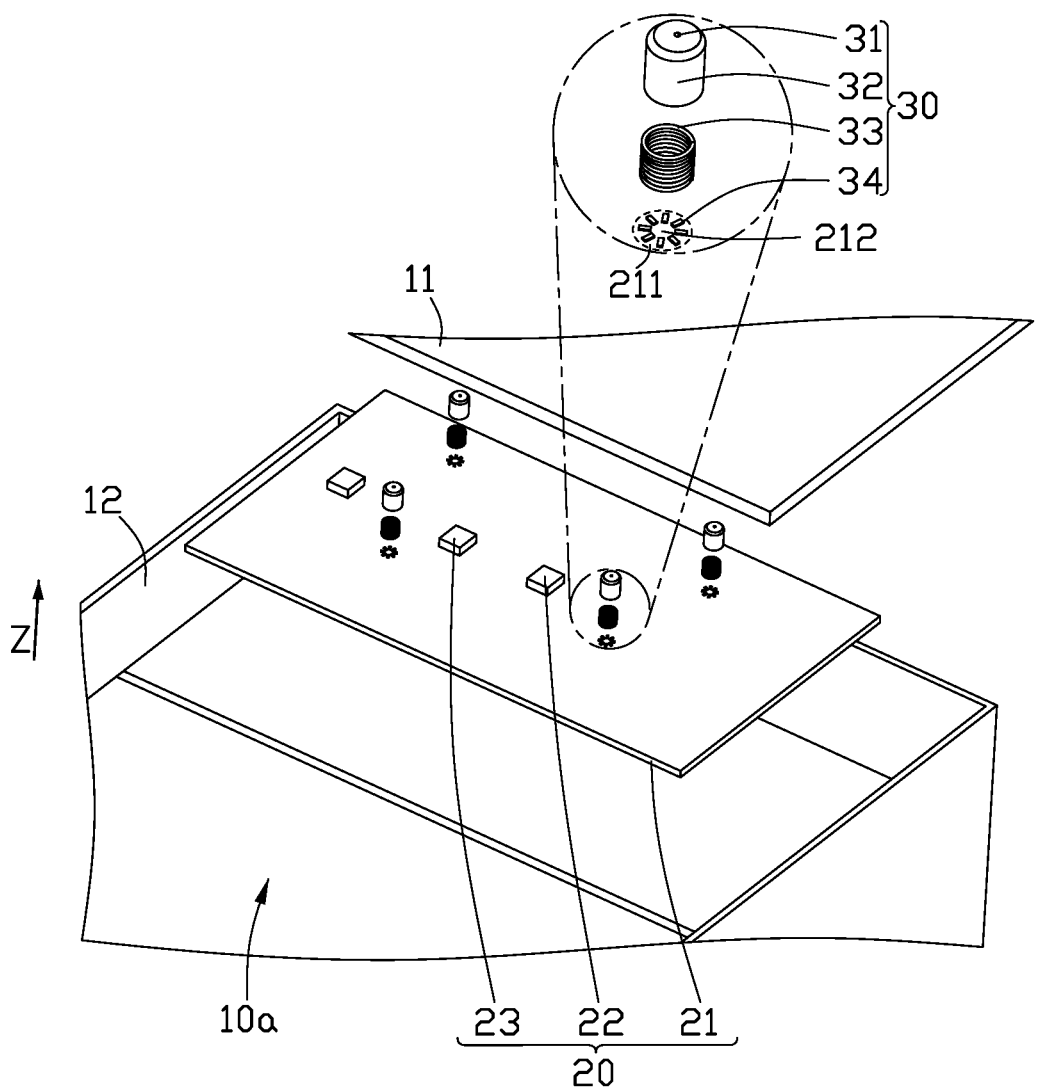
FIG. 2 is an exploded view of an embodiment of an electronic device according to the present disclosure.

Referring to FIG. 2, the electronic device 100 includes a housing mechanism 10, a circuit board assembly 20, and an anti-disassembly mechanism 30. The housing mechanism 10 defines an accommodating chamber 10a. The circuit board assembly 20 is disposed in the accommodating chamber 10a. The housing mechanism 10 is configured to protect the circuit board assembly 20.

The circuit board assembly 20 includes a substrate 21, a controller 22, a memory storage 23, and a computer program stored in the memory storage 23 and operable on the controller 22. The controller 22 and the memory storage 23 are both connected to the substrate 21. The substrate 21 includes a magnetic attraction area 211 which is made of magnetic attraction materials such as metal and can be attracted by a magnetic object. The magnetic attraction area 211, the controller 22, and memory storage 23 are spaced on the substrate 21 to reduce the risk of mutual interference. The controller 22 is configured to set a light intensity threshold. It can be understood that the light intensity threshold is the light intensity in the accommodating chamber 10a when the housing mechanism 10 is not disassembled.

The controller 22 can include one or more processors. The processor may be a central processing unit, or other general-purpose processors, digital signal processors, application specific integrated circuits, Field-Programmable Gate Arrays, or other programmable logic device, discrete gate or transistor logic device, discrete hardware component, etc. The general-purpose processor may be a microprocessor or the processor may also be any conventional processor, etc. The processor is the computing core and control center of the electronic device 100, uses various interfaces and lines to connect various parts of the entire electronic device 100, and obtains the operating system of the electronic device 100 and various installed applications, program codes, etc.

For example, the computer program can be divided into one or more modules/units, which are stored in the memory storage 23 and obtained by the controller 22 to complete the application. The one or more modules/units can be a series of computer program instruction segments that can complete specific functions, which are used to describe the acquisition process of the computer program in the electronic device 100.

The memory storage 23 can be used to store the computer program and/or module. The processor executes the computer program and/or module stored in the memory storage 23 to implement various functions of the electronic device 100. The memory storage 23 can include a storage program area and a storage data area, wherein the storage program area can store an operating system, an application program required for at least one function (such as a sound playback function, an image playback function, etc.); the storage data area can store data created according to the use of electronic devices. In addition, the memory storage 23 may include nonvolatile memory, such as hard disk, memory, plug-in hard disk, smart media card (SMC), secure digital (SD) card, flash card, at least one disk storage device, flash memory device, or other nonvolatile solid-state storage devices.

The memory storage 23 may be an external memory and/or an internal memory of the electronic device 100. Further, the memory 23 may be a memory in physical form, such as a memory module, a TF card, and the like.

When the modules/units integrated into the electronic device 100 are implemented in the form of software functional units having been sold or used as independent products, they can be stored in a non-transitory readable storage medium. Based on this understanding, all or part of the processes in the methods of the above embodiments implemented by the present disclosure can also be completed by related hardware instructed by computer-readable instructions. The computer-readable instructions can be stored in a non-transitory readable storage medium. The computer-readable instructions, when executed by the processor, may implement the steps of the foregoing method embodiments. The computer-readable instructions include computer-readable instruction codes, and the computer-readable instruction codes can be in a source code form, an object code form, an executable file, or some intermediate form. The non-transitory readable storage medium can include any entity or device capable of carrying the computer-readable instruction code, such as a recording medium, a U disk, a mobile hard disk, a magnetic disk, an optical disk, a computer memory, or a read-only memory (ROM).

The anti-disassembly mechanism 30 includes a light sensor 31, an electromagnetic element 32, and an elastic element 33. The light sensor 31 is configured to detect a light intensity in the accommodating chamber 10a. The electromagnetic element 32 and the magnetic attraction area 211 are disposed opposite to each other, and the elastic element 33 is disposed between the electromagnetic element 32 and the substrate 21. The light sensor 31 and electromagnetic element 32 are both electrically connected to the controller 22. The controller 22 is configured to receive a light intensity signal from the light sensor 31 and compare the light intensity signal with a preset light intensity threshold, and is further configured to control the electromagnetic element 32 to be powered on or powered off according to a comparison result between the light intensity signal and the light intensity threshold. Optionally, the light sensor 31 and the electromagnetic element 32 are electrically connected to the controller 22 through circuits in the substrate or wires outside the substrate 21.

Specifically, when the light intensity signal is less than or equal to the light intensity threshold, the controller 22 controls the electromagnetic element 32 to be powered on to generate magnetic attraction to the magnetic attraction area 211. In this case, an elastic force applied by the elastic element 33 to the electromagnetic element 32 is less than a magnetic attractive force applied by the electromagnetic element 32 to the magnetic attraction area 211, and thus the electromagnetic element 32 is attracted to the magnetic attraction area 211, and the elastic element 33 is compressed and fixed between the electromagnetic element 32 and the magnetic attraction area 211 by the attractive force between the electromagnetic element 32 and the magnetic attraction area 211. When the light intensity signal is greater than the light intensity threshold, the controller 22 controls the electromagnetic element 32 to be powered off, causing the attractive magnetic force between the electromagnetic element 32 and the magnetic attraction area 211 to disappear. In this case, the electromagnetic element 32 is separated from the magnetic attraction area 211 by an elastic restoring force of the elastic element 33.

In the electronic device 100, in the case where the housing mechanism has not been disassembled, the light sensor 31 detects that the light intensity in the accommodating chamber 10a will be less than or equal to the light intensity threshold. In the case where the housing mechanism 10 has been disassembled or damaged, a gap communicating with the accommodating chamber 10a will be formed in the housing mechanism 10, so that the light intensity in the accommodating chamber 10a will be increased, and the light sensor 31 detects that the light intensity in the accommodating chamber 10a will be greater than the light intensity threshold. When the light intensity signal is less than or equal to the light intensity threshold, the electromagnetic element 32 is energized to generate magnetic attraction to the magnetic attraction area 211. When the light intensity signal is greater than the light intensity threshold, the electromagnetic element 32 is powered off to be separated from the magnetic attraction area 211 by the elastic restoring force of the elastic element 33. When the user observes that the electromagnetic element 32 has not been installed on the magnetic suction area 211, it can be determined that the housing mechanism 10 has been disassembled, thereby accurately detecting whether the electronic device 100 has been disassembled.

It can be understood that in the case where the housing mechanism 10 is not disassembled, the light intensity in the accommodating chamber 10a of different housing mechanisms 10 varies, and the light intensity threshold can be adjusted adaptively.

Referring to FIGS. 1 and 2, in some embodiments, the housing mechanism 10 includes a housing 11 and a cover 12. The housing 11 is connected to the cover 12, and the housing 11 and the cover 12 enclose a space. The accommodating chamber 10a is in a space formed by the housing 11 and the cover 12. When the housing 11 and the cover 12 are disassembled, a gap communicating with the accommodating chamber 10a will be formed between the housing 11 and the cover 12, resulting in increased illumination in the accommodating chamber 10a. It can be understood that when the housing mechanism 10 defines a through hole, such as a heat dissipation hole or a connection hole, communicating with the housing cavity 10a, the housing mechanism 10 further includes a partition (not shown), which is located in the accommodating chamber 10a and between the light sensor 31 and the through hole to isolate the light sensor 31 and the through hole, reducing the risk of interference caused by the light from the through hole to the light sensor 31.

Figure 3:
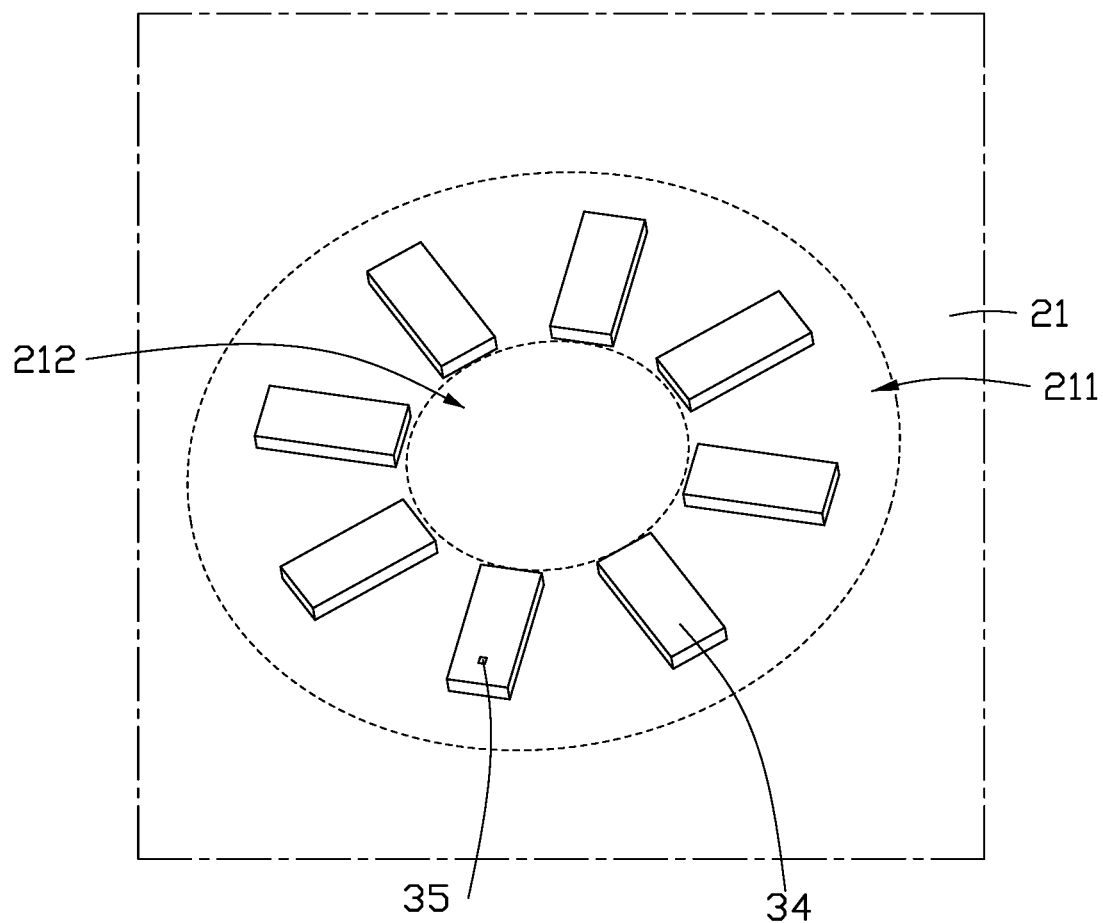
FIG. 3 is a schematic view of an embodiment of a magnetic attraction area of an electronic device according to the present disclosure.
Figure 4:
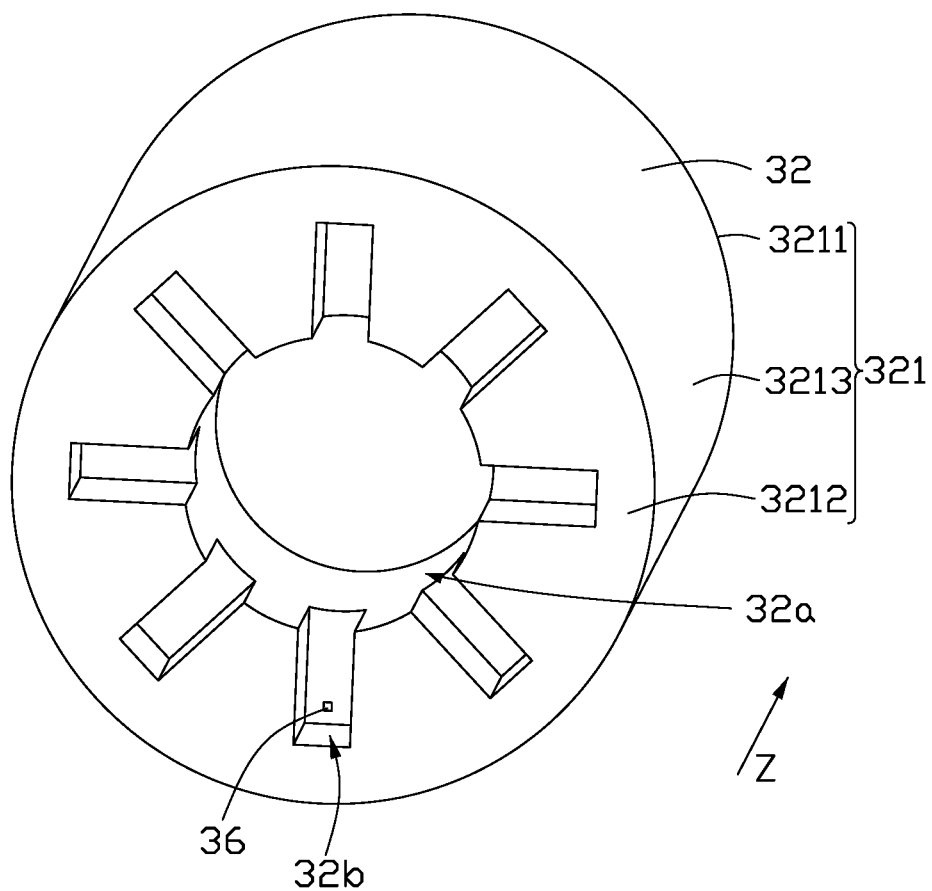
FIG. 4 is a schematic view of an embodiment of an electromagnetic element of an electronic device according to the present disclosure.

Referring to FIGS. 3 and 4, in some embodiments, the substrate 21 further includes a resisting area 212, and the magnetic attraction area 211 is arranged surrounding the circumference of the resisting area 212. One end of the electromagnetic element 32 facing the substrate 21 defines a resisting groove 32a. At least a part of the elastic element 33 is received in the resisting groove 32a, an end of the elastic element 33 abuts against a bottom of the resisting groove 32a, and the other end of the elastic element 33 abuts against the resisting area 212, reducing risk of the elastic element 33 detaching from the electromagnetic element 32 and the substrate 21 when the electromagnetic element 32 generates magnetic attraction.

Specifically, the elastic element 33 is a spring, the resisting area 212 is in a circular shape, and the magnetic attraction area 211 is in a circular ring surrounding the circumference of the resisting area 212. A direction perpendicular to the substrate 21 is defined as a first direction Z. In the first direction Z, a projection of the resisting groove 32a onto the substrate 21 overlaps with the resisting area 212, which helps to hold the elastic member 33.

Referring to FIGS. 3 and 4, in some embodiments, the anti-disassembly mechanism 30 further includes a plurality of limit blocks 34 protruding from the magnetic attraction area 211, and the limit blocks 34 are equidistantly arranged surrounding the circumference of the resisting area 212. The end of the electromagnetic element 32 facing the substrate 21 further defines a plurality of limit grooves 32b, which are equidistantly arranged surrounding a circumference of the resisting groove 32a. The limit grooves 32b are connected one-to-one to the limit blocks 34, thereby reducing the risk of separation between the electromagnetic element 32 and the magnetic attraction area 211 due to deviation between the electromagnetic element 32 and the magnetic attraction area 211 when the electromagnetic element 32 generates magnetic attraction, improving the accuracy of detection. The limit grooves 32b are received in the limit blocks 34.

It can be understood that the limit blocks 34 are equidistantly arranged surrounding the circumference of the resisting area 212, and the limit grooves 32b are equidistantly arranged surrounding the circumference of the resisting groove 32a, meaning that one limit block 34 can be connected to any limit groove 32b, and the remaining limit blocks 34 can also be connected one-to-one to the remaining limit grooves 32b.

Referring to FIGS. 3 and 4, in some embodiments, the limit blocks 34 are made of conductive materials and electrically connected to the controller 22 through circuits within the substrate 21. The controller 22 is further configured to control one of the limit blocks 34 to be powered on while controlling the others limit blocks 34 to be powered off.

The anti-disassembly mechanism 30 further includes a first connection terminal 35 and a second connection terminal 36. The energized limit block 34 is defined as the first connection terminal 35. The second connection terminal 36 is received in and connected to one of the limit grooves 32b and electrically connected to the electromagnetic element 32. The first connection terminal 35 is configured to connect with the second connection terminal 36 to form a conductive path between the controller 22 and the electromagnetic element 32. That is, when the first connection terminal 35 and the second connection terminal 36 are connected, the conductive path between the electromagnetic element 32 and the controller 22 is connected, and the controller 22 can control the electromagnetic element 32 to power on or power off. When the first connection terminal 35 and the second connection terminal 36 are separated, the conductive path between the electromagnetic element 32 and the controller 22 is disconnected, and the controller 22 is unable to control the energization of the electromagnetic element 32 to make the electromagnetic element 32 attach to the magnetic attraction area 211, causing the elastic element 33 to spring the electromagnetic element 32 away from the substrate 21.

When a user restores the separated electromagnetic element 32 to contact the magnetic attraction area 211, it is not easy to determine which limit block 34 is the first connection terminal 35 from the appearance, and thus the first connection terminal 35 cannot be easily connected to the limit groove 32b equipped with the second connection terminal 36, causing the conductive path between the electromagnetic element 32 and the controller 22 to be disconnected. Therefore, the controller 22 cannot control the electromagnetic element 32 to be energized to make the electromagnetic element 32 reattach to the magnetic attraction area 211, and the elastic element 33 will spring the electromagnetic element 32 away from the substrate 21, thereby increasing the difficulty of restoring the electronic device 100 after disassembly and further improving the accuracy of the detection.

Optionally, the number of limit blocks 34 and limit grooves 32b is eight, an angle between two adjacent limit blocks 34 is 45°, and an angle between two adjacent limit grooves 32b is 45°.

It can be understood that in other embodiments, the number of limit blocks 34 and limit grooves 32b can also be two, three, four, five, six, nine, ten, twelve, etc. The greater the number of limit blocks 34 and limit grooves 32b, the less likely it is for the user to connect the limit block 34 with the first connection terminal 35 to the limit groove 32b with the second connection terminal 36 when restoring the separated electromagnetic element 32 to the magnetic attraction area 211, increasing the difficulty of restoring the electronic device 100 after disassembly.

Referring to FIGS. 3 and 4, in some embodiments, a peripheral wall of the elastic member 33 is in contact with the limit blocks 34, and the limit grooves 32b are communicated with the resisting groove 32a, so that when the elastic member 33 is accommodated between the resisting area 212 and the resisting groove 32a, the limit grooves 32b are connected one-to-one to the limit blocks 34.

Figure 5:
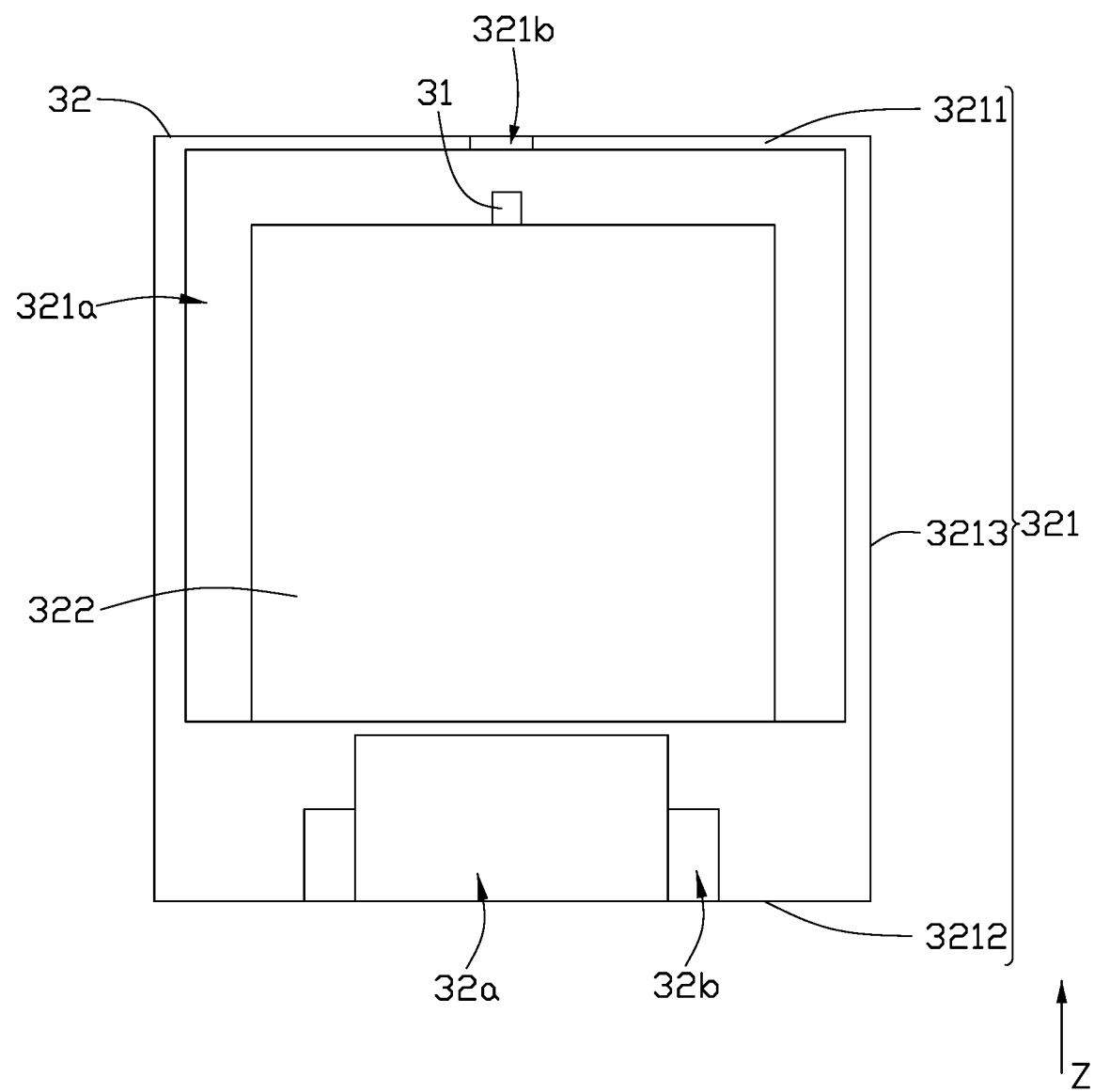
FIG. 5 is a cross-sectional view of an embodiment of an electromagnetic element of an electronic device according to the present disclosure.

Referring to FIGS. 4 and 5, in some embodiments, the electromagnetic element 32 includes a shell 321 and an electromagnet 322. The shell 321 is made of insulating material, and the shell 321 includes a top wall 3211, a bottom wall 3212, and a peripheral wall 3213. The top wall 3211 and the bottom wall 3212 are arranged opposite to each other across the peripheral wall 3213, and the peripheral wall 3213, the top wall 3211 and the bottom wall 3212 enclose a receiving cavity 321a for accommodating the electromagnet 322. The resisting groove 32a and the limit groove 32b are provided by recessing the bottom wall 3212, and the area of the bottom wall 3212 that is separated from the resisting grooves 32a and the limit grooves 32b is configured to contact the magnetic attraction area 211.

The electromagnet 322 is electrically connected to the second connection terminal 36 for electrical connection with the controller 22 when the first connection terminal 35 and the second connection terminal 36 are connected. Specifically, when the electromagnet 322 is energized, the electromagnet 322 generates a magnetic force which attracts the magnetic attraction area 211, so that the shell 321 holding the electromagnet 322 is attracted to the magnetic attraction area 211. When the electromagnet 322 is powered off, the magnetic force generated by the electromagnet 322 disappears, so that the shell 321 is separated from the magnetic attraction area 211 by the elastic restoring force of the elastic member 33.

In some embodiments, in the first direction Z, the projection of the top wall 3211 and the projection of the bottom wall 3212 are circular and overlap with each other, and the shell 321 is substantially cylindrical.

It can be understood that in other embodiments, the projection of the top wall 3211 and the projection of the bottom wall 3212 are circular, and the projection of the top wall 3211 is located within the projection of the bottom wall 3212. The shell 321 is substantially in a circular shape, which helps to reduce the space occupied by the top of the electromagnetic element 32.

Referring to FIGS. 4 and 5, in some embodiments, the light sensor 31 is connected to the top wall 3211, improving integration of the anti-disassembly mechanism 30. Optionally, the second connection terminal 36 is further connected to the light sensor 31, and the first connection terminal 35 is configured to connect with the second connection terminal 36 to form the conductive path between the controller 22 and the light sensor 31. That is, when the first connection terminal 35 and the second connection terminal 36 are connected, the conductive path between the optical sensor 31 and the controller 22 is connected, and the optical sensor 31 can be energized to sense the light intensity in the accommodating cavity 10a. When the first connection terminal 35 and the second connection terminal 36 are separated, the conductive path of the optical sensor 31 and the controller 22 is disconnected, and the controller 22 is unable to receive the light intensity signal from the light sensor 31, so that the controller 22 is unable to compare the light intensity signal with the preset light intensity threshold to control the electromagnetic element 32 to be powered on or powered off.

Optionally, the light sensor 31 is connected to a side of the top wall 3211 facing away from the accommodating chamber 10a. In other embodiments, the light sensor 31 is located in the receiving cavity 321a, the top wall 3211 defines a light passage 321b for facilitating light passing through, and the light sensor 31 detects the light intensity in the accommodating chamber 10a through the light passage 321b, so that the shell 321 protects the light sensor 31. In one embodiment, the light passage 321b is a through hole.

It can be understood that the light sensor 31 can also be connected to the substrate 21, which helps to directly connect the substrate 21 to the controller 22.

In some embodiments, the memory storage 23 is used to store a record of power outage of the electromagnetic element 32, which helps to determine whether the housing mechanism 10 has been disassembled. Specifically, when there is a record of power outage of the electromagnetic element 32, it can be determined that the housing mechanism 10 has been disassembled.

It can be understood that the memory storage 23 can also be used to store a record of disconnection between the first connection terminal 35 and the second connection terminal 36, which helps to determine whether the housing mechanism 10 has been disassembled. Specifically, when there is a record of disconnection between the first connection terminal 35 and the second connection terminal 36, it can be determined that the housing mechanism 10 has been disassembled.

In some embodiments, the circuit board assembly 20 also includes a capacitor (not shown), which is used to temporarily supply power to the circuit board assembly 20 when an external power supply does not supply power to the circuit board assembly 20, thereby reducing risk of electromagnetic element 32 being disconnected from the magnetic attraction area 211 due to power outage of the circuit board element 20, and reducing risk of misjudgment.

Referring to FIG. 2, in some embodiments, the substrate 21 includes a plurality of magnetic attraction areas 211, and the electronic device 100 includes a plurality of anti-disassembly mechanisms 30. The anti-disassembly mechanisms 30 are connected one-to-one to the magnetic attraction areas 211, improving a detection range of the light sensor 31, and thus improving accuracy of detection. Optionally, the number of the magnetic attraction areas 211 is four, the number of the anti-disassembly mechanisms 30 is four, and the magnetic attraction areas 211 and anti-disassembly mechanisms 30 are distributed surrounding the substrate 21.

Figure 6:
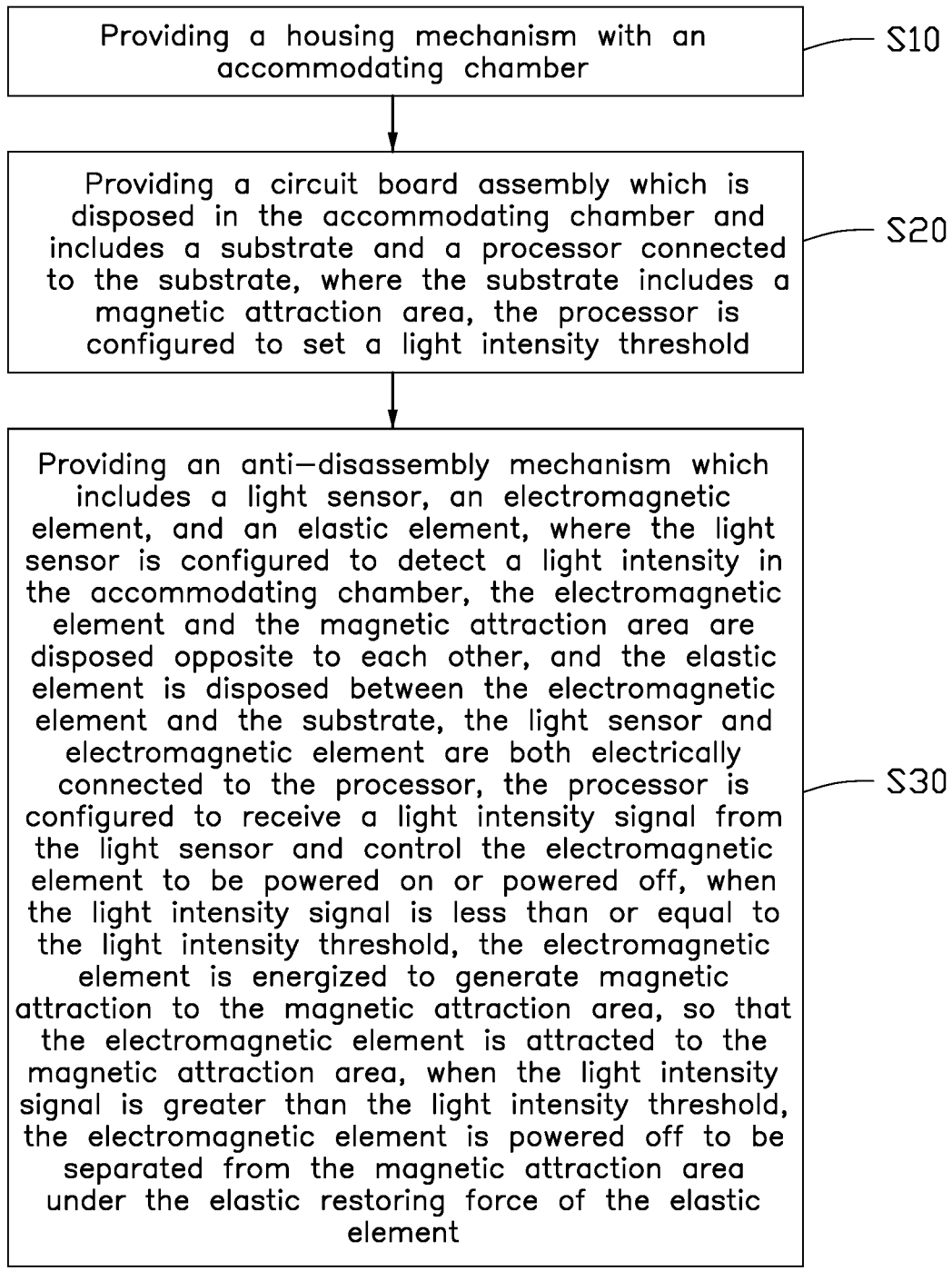
FIG. 6 is a flow chart of an embodiment of an anti-disassembly method according to the present disclosure.

Referring to FIG. 6, a flowchart of an anti-disassembly method is presented in accordance with an embodiment which is being thus illustrated. The anti-disassembly method described below can be carried out using the configurations illustrated in FIGS. 1-5, for example, and various elements of these figures are referenced in explaining example method. The exemplary anti-disassembly method can begin at block S10.

At block S10, the housing mechanism 10 with the accommodating chamber 10a is provided.

At block S20, the circuit board assembly 20 is provided. The circuit board assembly 20 is disposed in the accommodating chamber 10a. The circuit board assembly 20 includes the substrate 21 and the controller 22 connected to the substrate 21. The substrate 21 includes the magnetic attraction area 211. The controller 22 is configured to set the light intensity threshold.

At block S30, the anti-disassembly mechanism 30 is provided. The anti-disassembly mechanism 30 includes the light sensor 31, the electromagnetic element 32, and the elastic element 33. The light sensor 31 is configured to detect a light intensity in the accommodating chamber 10a. The electromagnetic element 32 and the magnetic attraction area 211 are disposed opposite to each other, and the elastic element 33 is disposed between the electromagnetic element 32 and the substrate 21. The light sensor 31 and electromagnetic element 32 are both electrically connected to the controller 22. The controller 22 is configured to receive a light intensity signal from the light sensor 31 and control the electromagnetic element 32 to be powered on or powered off. When the light intensity signal is less than or equal to the light intensity threshold, the electromagnetic element 32 is energized to generate magnetic attraction to the magnetic attraction area 211 so that the electromagnetic element 32 is attracted to the magnetic attraction area 211. When the light intensity signal is greater than the light intensity threshold, the electromagnetic element 32 is powered off to be separated from the magnetic attraction area 211 by the elastic restoring force of the elastic element 33.

Before the electronic device 100 leaves a factory, a process of installing the anti-disassembly mechanism 30 on the circuit board assembly 20 is as follows. The controller 22 executes the computer program stored in the memory storage 23 to not compare the light intensity signal from the light sensor 31 with the light intensity threshold, and to keep the first connection terminal 35 energized, so that when the first connection terminal 35 and the second connection terminal 36 are connected, the electromagnetic element 32 is energized, thereby causing the electromagnetic element 32 to be attracted to the magnetic attraction area 211.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An electronic device comprising:
   a housing mechanism defining an accommodating chamber;
   a circuit board assembly accommodated in the accommodating chamber and comprising a substrate and a controller connected to the substrate, the substrate comprising a magnetic attraction area; and
   an anti-disassembly mechanism comprising a light sensor, an electromagnetic element, and an elastic element,
   wherein the light sensor is configured to detect a light intensity in the accommodating chamber, the electromagnetic element and the magnetic attraction area are arranged opposite to each other, the elastic element is disposed between the electromagnetic element and the substrate, and the light sensor and the electromagnetic element are electrically connected to the controller,
   the controller is configured to receive a light intensity signal from the light sensor and compare the light intensity signal with a light intensity threshold, the controller is further configured to control the electromagnetic element to be powered on or powered off according to a comparison result between the light intensity signal and the light intensity threshold,
   when the light intensity signal is less than or equal to the light intensity threshold, the controller controls the electromagnetic element to be powered on, and the electromagnetic element is attracted to the magnetic attraction area, and
   when the light intensity signal is greater than the light intensity threshold, the controller controls the electromagnetic element to be powered off, and the electromagnetic element is separated from the magnetic attraction area by the elastic element.

2. The electronic device of claim 1, wherein the housing mechanism comprises a housing and a cover, the housing and the cover enclose a space, the accommodating chamber is in the space.

3. The electronic device of claim 1, wherein the substrate further comprises a resisting area, the magnetic attraction area is arranged surrounding the resisting area, the electromagnetic element defines a resisting groove, and the elastic element is received in the resisting groove and abuts against the resisting area.

4. The electronic device of claim 3, wherein the anti-disassembly mechanism further comprises a plurality of limit blocks protruding from the magnetic attraction area, the electromagnetic element further defines a plurality of limit grooves, each of the plurality of limit blocks is received in and connected to a corresponding limit groove of the plurality of limit grooves.

5. The electronic device of claim 4, wherein the plurality of limit blocks is equidistantly arranged surrounding the resisting area, and the plurality of limit grooves is equidistantly arranged surrounding the resisting groove.

6. The electronic device of claim 5, wherein the plurality of limit blocks is electrically connected to the controller, and the controller is further configured to control a limiting block of the plurality of limit blocks to be powered on and control the others to be powered off.

7. The electronic device of claim 6, wherein the anti-disassembly mechanism further comprises a first connection terminal and a second connection terminal, the first connection terminal is the limit block that is powered on, the second connection terminal is received in one of the plurality of limit grooves and electrically connected to the electromagnetic element, the first connection terminal is connected to the second connection terminal to form a conductive path between the controller and the electromagnetic element.

8. The electronic device of claim 7, wherein the electromagnetic element further comprises a shell and an electromagnet, the shell comprises a top wall, a bottom wall, and a peripheral wall, the top wall and the bottom wall are opposite to each other across the peripheral wall, the top wall, the bottom wall, and the peripheral wall enclose a receiving cavity, the receiving cavity is configured for accommodating the electromagnet, the resisting groove and the plurality of limit grooves are recesses on the bottom wall, the electromagnet is electrically connected to the second connection terminal.

9. The electronic device of claim 8, wherein the light sensor is connected to the top wall.

10. The electronic device of claim 8, wherein the top wall defines a light passage, and the light sensor is disposed in the receiving cavity.

11. The electronic device of claim 4, wherein the elastic member is in contact with the plurality of limit blocks.

12. The electronic device of claim 1, wherein the circuit board assembly further comprises a memory storage connected to the substrate and the controller, the memory storage stores records of power outage of the electromagnetic element.

13. An electronic device comprising:
 a housing mechanism defining an accommodating chamber;
 a circuit board assembly accommodated in the accommodating chamber and comprising a substrate and a controller connected to the substrate, the substrate comprising a magnetic attraction area; and
 an anti-disassembly mechanism comprising a light sensor, an electromagnetic element, and an elastic element,
 wherein the light sensor is configured to detect a light intensity in the accommodating chamber, the electromagnetic element comprises an electromagnet and a shell defining a receiving cavity for accommodating the electromagnet, the electromagnet and the magnetic attraction area are disposed opposite to each other, the elastic element is disposed between the electromagnetic element and the substrate, and the light sensor and the electromagnetic element are electrically connected to the controller,
 the controller is configured to receive a light intensity signal from the light sensor and compare the light intensity signal with a light intensity threshold, the controller is further configured to control the electromagnetic element to be powered on or powered off according to a comparison result between the light intensity signal and the light intensity threshold,
 when the light intensity signal is less than or equal to the light intensity threshold, the controller controls the electromagnetic element to be powered on and the electromagnetic element is attracted to the magnetic attraction area, and
 when the light intensity signal is greater than the light intensity threshold, the controller controls the electromagnetic element to be powered off and the electromagnetic element is separated from the magnetic attraction area by the elastic element.

14. The electronic device of claim 13, wherein the substrate further comprises a resisting area, the magnetic attraction area is arranged surrounding the resisting area, the electromagnetic element defines a resisting groove, and the elastic element is received in the resisting groove and abuts against the resisting area.

15. The electronic device of claim 14, wherein the anti-disassembly mechanism further comprises a plurality of limit blocks protruding from the magnetic attraction area, the electromagnetic element further defines a plurality of limit grooves, each of the plurality of limit blocks is received in and connected to a corresponding limit groove of the plurality of limit grooves.

16. The electronic device of claim 15, wherein the plurality of limit blocks is equidistantly arranged surrounding the resisting area, and the plurality of limit grooves is equidistantly arranged surrounding the resisting groove.

17. The electronic device of claim 16, wherein the plurality of limit blocks is electrically connected to the controller, and the controller is further configured to control a limiting block of the plurality of limit blocks to be powered on and control the others to be powered off.

18. The electronic device of claim 17, wherein the anti-disassembly mechanism further comprises a first connection terminal and a second connection terminal, the first connection terminal is the limit block that is powered on, the second connection terminal is received in one of the plurality of limit grooves and electrically connected to the electromagnetic element, the first connection terminal is connected to the second connection terminal to form a conductive path between the controller and the electromagnetic element.

19. The electronic device of claim 18, wherein the shell comprises a top wall, a bottom wall, and a peripheral wall, the top wall and the bottom wall are opposite to each other across the peripheral wall, the top wall, the bottom wall, and the peripheral wall enclose the receiving cavity, the resisting groove and the plurality of limit grooves are recesses on the bottom wall, the electromagnet is electrically connected to the second connection terminal.

20. The electronic device of claim 19, wherein the top wall defines a light passage, and the light sensor is disposed in the receiving cavity.

* * * * *